United States Patent

Ushiki et al.

[11] Patent Number: 6,161,747
[45] Date of Patent: Dec. 19, 2000

[54] BONDING APPARATUS

[75] Inventors: Hiroshi Ushiki, Iruma; Kazuo Sugiura, Akishima; Koichi Takahashi, Musashimurayama, all of Japan

[73] Assignee: Kabushiki Kaisha Shinkawa, Tokyo, Japan

[21] Appl. No.: 09/249,354

[22] Filed: Feb. 12, 1999

[30] Foreign Application Priority Data

Feb. 12, 1998 [JP] Japan ................................. 10-044198

[51] Int. Cl.$^7$ .......................... B23K 37/00; B23K 31/02; B23K 31/00
[52] U.S. Cl. .................. 228/4.5; 228/178; 228/180.5
[58] Field of Search ............................... 228/4.5, 180.5, 228/178

[56] References Cited

U.S. PATENT DOCUMENTS 5,951,283  9/1999  Ushiki et al. ....................... 432/253

FOREIGN PATENT DOCUMENTS

H2-273945  11/1990  Japan .
H4-41519   7/1992   Japan .
H7-86286   3/1995   Japan .

*Primary Examiner*—Patrick Ryan
*Assistant Examiner*—Zidia T. Pittman
*Attorney, Agent, or Firm*—Koda & Androlia

[57] ABSTRACT

In a bonding apparatus such as a bump bonding apparatus, tape bonding apparatus or the like, a positioning claw which is used for positioning a semiconductor pellet on a bonding stage of the bonding apparatus is provided on a bonding head or on an XY table on which the bonding head is installed.

2 Claims, 1 Drawing Sheet

BONDING APPARATUS

BACKGROUND OF THE INVENTION

1. Field of the Invention

The present invention relates to a bonding apparatus such as a bump bonding apparatus, tape bonding apparatus, etc. and more particularly to a semiconductor pellet positioning mechanism used in a bonding apparatus.

2. Prior Art

In a bump bonding apparatus, for instance, as disclosed in Japanese Patent Application Laid-Open (Kokai) Nos. H2-273945 and H7-86286 and also in Japanese Patent Application Publication (Kokoku) No. H4-41519, after a ball is formed on the tip of a bonding wire (merely called "wire"), the wire is pressed against the electrode of a semiconductor pellet and then cut from the root portion of the ball, thus forming a bump on the electrode of the semiconductor pellet.

In a bump bonding apparatus of this type, semiconductor pellets are placed on a positioning stage from a wafer or tray in which the semiconductor pellets are stored. The semiconductor pellets positioned by this positioning stage are forwarded to a bonding stage and positioned there, then bumps are formed on the electrodes of the semiconductor pellet by the bonding apparatus as described above.

The above prior art includes a positioning stage and positioning claw which position the semiconductor pellet, and a driving means is further provided for driving the positioning claw or positioning stage in the X and Y (horizontal) directions. As a result, the structure tends to be large, and the cost of the apparatus tends to be high.

SUMMARY OF THE INVENTION

Accordingly, the object of the present invention is to provide a bonding apparatus that requires no large structured elements such as a positioning stage, a positioning claw for positioning the semiconductor pellet, or a positioning and driving means for the positioning stage, etc., so that the manufacturing cost of the apparatus can be minimized.

The above object is accomplished by a unique structure for a bonding apparatus wherein a positioning claw for positioning a semiconductor pellet on a bonding stage is provided on a bonding head or an XY table on which the bonding head is mounted.

DETAILED DESCRIPTION OF THE INVENTION

Figure 1:
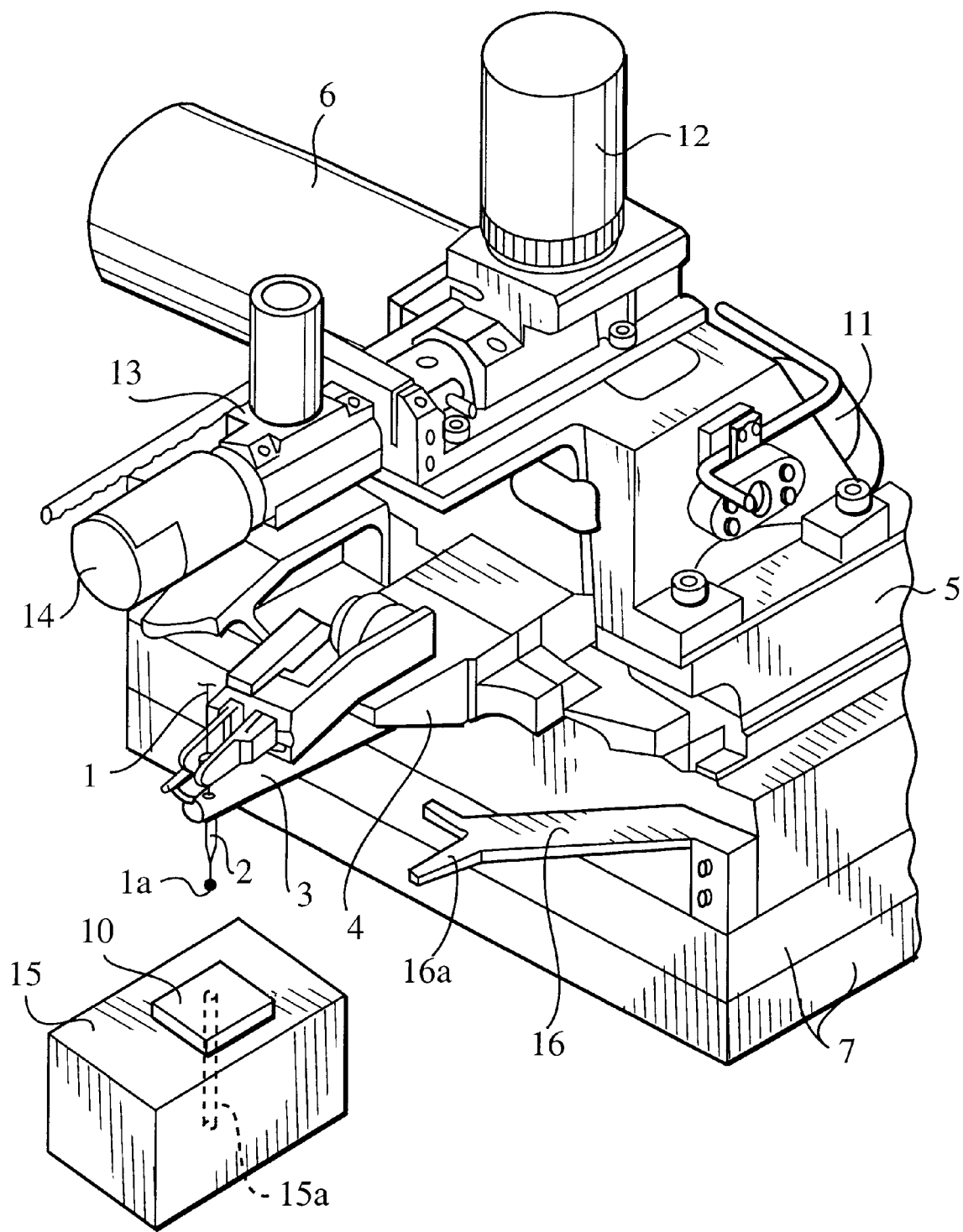
FIG. 1 is a perspective view of one embodiment of the bonding apparatus according to the present invention.

One embodiment will be described with reference to FIG. 1.

A capillary 2 through which a wire 1 passes is attached to one end of a bonding horn 3, and this bonding horn 3 is provided on a lifter arm 4. The lifter arm 4 is mounted on a bonding head 5 so that the lifter arm 4 can swing or move upward and downward. The lifter arm 4 is caused to swing or move upward and downward by a Z-axis motor 6 provided on the bonding head 5 which is provided on an XY table 7.

The reference numeral 11 is a bonding load linear motor 11. The bonding load linear motor 11 applies a bonding load that presses a ball 1a formed on the tip of the wire 1 against the electrode of a semiconductor pellet 10. The coil side of this bonding load liner motor 11 is fastened to the lifter arm 4, and the magnet side of this linear motor 11 is fastened to the bottom surface of the bonding head 5. A detection camera 12 which picks up an image of the semiconductor pellet 10 is provided on the bonding head 5, and this camera 12 is connected to one end of a horizontally disposed lens tube 13. A detection head 14 which inputs the image of the semiconductor pellet 10 is disposed at another end of the lens tube 13. The semiconductor pellet 10 is held by vacuum suction on the bonding stage 15 by means of a suction attachment hole 15a formed in the bonding stage 15.

The above structure is universally known, and a further description will be omitted.

In the present embodiment, a positioning claw 16 is provided on the XY table 7. The positioning part 16a of the positioning claw 16 extends to the rear portion of the capillary 2 and to beneath the bonding horn 3. The positioning claw 16 is provided so that the undersurface of the positioning part 16a is slightly above the upper surface of the bonding stage 15. The positioning part 16a is shaped so that it matches the shape of a corner of the semiconductor pellet 10 placed on the bonding stage 15.

Next, the operation of the bonding apparatus will be described.

First, a semiconductor pellet 10 is picked up from a tray or wafer (not shown) by a pick-up and conveying means (not shown) and conveyed and placed on the surface of the bonding stage 15. When the conveyance of the semiconductor pellet 10 to the bonding stage 15 begins, a first vacuum suction in the suction attachment hole 15a of the bonding stage 15 is started, and a state of suction for a pellet is created. The suction force created by the first vacuum suction allows the semiconductor pellet 10 to be moved on the bonding stage 15 by the positioning claw 16 (described later) without causing any damage to the semiconductor pellet 10.

Next, the XY table 7 is driven so that the positioning part 16a of the positioning claw 16 comes into contact and presses against the corner part of the semiconductor pellet 10. When the positioning part 16a of the positioning claw 16 pushes and sets the semiconductor pellet 10 on a predetermined position, the first vacuum suction is switched to a second vacuum suction so that the semiconductor pellet 10 is firmly held on the bonding stage 15 by this second vacuum suction which is stronger than the first vacuum suction. The, the XY table 7 is driven so that the detection head 14 of the lens tube 13 is positioned above the semiconductor pellet 10. After this, the positioning claw 16 is withdrawn from the surface of the bonding stage 15.

In the above operation, the first vacuum suction is effected in the suction attachment hole 15a before the semiconductor pellet 10 is set on the bonding stage 15. However, the first vacuum suction can be omitted. In other words, it can be designed so that the semiconductor pellet 10 is placed on the bonding stage 15 and set on the predetermined position by the positioning craw 16 without using the first vacuum suction. In this operation, the first vacuum suction is OFF until the pellet is set on the predetermined position, and the second vacuum suction, which is stronger than the first vacuum suction, is effected after the pellet 10 is set on the predetermined position by the positioning craw 16.

Afterward, as in a conventional apparatus, an image of the electrode on the semiconductor pellet 10 (which is the bonding position) is picked up by the detection camera 12 via the detection head 14 and lens tube 13, and the ball 1a formed on the tip of the wire 1 is bonded to the bonding position on the electrode of the semiconductor pellet 10. Then, after bonding, the wire 1 is cut from the root portion of the ball 1a, thus forming a bump on the electrode of the semiconductor pellet 10.

As seen from the above, in the present invention, the positioning claw 16 is provided on the XY table 7. Accordingly, a positioning stage which is large in structure is unnecessary. In addition, since the positioning claw 16 is driven by the XY table 7 of the bonding apparatus itself, a bulky driving means for the positioning claw 16 is also unnecessary. As a result, the apparatus can be simple in structure, and the cost of the apparatus can be reduced.

In the above embodiment, the positioning claw 16 is disposed on the XY table 7. It is also possible to provide this positioning claw 16 on the bonding head 5 which is mounted on the XY table 7 or on any constituting member provided on the bonding head 5. Moreover, in the above, the description is made with reference to a bump bonding apparatus. However, it goes without saying that the present invention is applicable to a tape bonding apparatus in which semiconductor pellets are set on the bonding stage and bonded to leads formed on a carrier tape.

As seen from the above, in the present invention, a positioning claw which is used to position a semiconductor pellet on a bonding stage is provided on a bonding head or on an XY table on which the bonding head is mounted. Accordingly, large structures such as a semiconductor pellet positioning stage and positioning claw, or a positioning and driving means for the positioning stage, etc. are not required; and as a result, the cost of the apparatus can be reduced.

What is claimed is:

1. A bonding apparatus for a semiconductor pellet comprising a bonding head and a positioning claw provided on said bonding head for positioning a semiconductor pellet on a bonding stage.

2. A bonding apparatus for a semiconductor pellet comprising:

an XY table;

a bonding head mounted on said XY table; and a positioning claw provided on said XY table for positioning a semiconductor pellet on a bonding stage.

* * * * *